United States Patent
Armour et al.

(10) Patent No.: US 9,748,113 B2
(45) Date of Patent: Aug. 29, 2017

(54) METHOD AND APPARATUS FOR CONTROLLED DOPANT INCORPORATION AND ACTIVATION IN A CHEMICAL VAPOR DEPOSITION SYSTEM

(71) Applicant: Veeco Instruments, Inc., Plainview, NY (US)

(72) Inventors: Eric Armour, Pennington, NJ (US); George Papasouliotis, Warren, NJ (US); Daewon Kwon, Whippany, NJ (US)

(73) Assignee: Veeco Intruments Inc., Plainview, NY (US)

( * ) Notice: Subject to any disclaimer, the term of this patent is extended or adjusted under 35 U.S.C. 154(b) by 51 days.

(21) Appl. No.: 14/814,153

(22) Filed: Jul. 30, 2015

(65) Prior Publication Data
US 2017/0032974 A1 Feb. 2, 2017

(51) Int. Cl.
| H01L 21/02 | (2006.01) |
| H01L 21/285 | (2006.01) |
| H01L 21/768 | (2006.01) |
| H01L 21/324 | (2006.01) |
| H01L 29/20 | (2006.01) |

(Continued)

(52) U.S. Cl.
CPC ........ *H01L 21/3245* (2013.01); *C23C 16/047* (2013.01); *C23C 16/4584* (2013.01); *C23C 16/482* (2013.01); *C23C 16/52* (2013.01); *H01L 21/0254* (2013.01); *H01L 21/0262* (2013.01); *H01L 29/20* (2013.01); *H01L 29/2003* (2013.01); *H01L 29/205* (2013.01); *H01L 29/66431* (2013.01); *H01L 29/7787* (2013.01); *H01L 33/0075* (2013.01); *H01L 33/32* (2013.01)

(58) Field of Classification Search
CPC .......................... H01L 21/3245; C23C 16/047
USPC ............................................ 257/76; 438/509
See application file for complete search history.

(56) References Cited

U.S. PATENT DOCUMENTS

| 5,759,281 A | 6/1998 | Gurary et al. |
| 6,217,662 B1 | 4/2001 | Kong et al. |

(Continued)

FOREIGN PATENT DOCUMENTS

| JP | 2004-537060 A | 12/2004 |
| JP | 2006-108312 | 4/2006 |

OTHER PUBLICATIONS

Armour, Eric. "UV-Illumination: Point Defect Management in GaN Growth". Growth Meeting, Jan. 9, 2015, 5 pages.

(Continued)

*Primary Examiner* — Moazzam Hossain
(74) *Attorney, Agent, or Firm* — Patterson Thuente Pedersen, P.A.

(57) ABSTRACT

Embodiments include systems and methods for producing semiconductor wafers having reduced quantities of point defects. These systems and methods include a tunable ultraviolet (UV) light source, which is controlled to produce a raster of a UV light beam across a surface of a semiconductor wafer during epitaxial growth to dissociate point defects in the semiconductor wafer. In various embodiments, the tunable UV light source is configured external to a Metal Organic Chemical Vapor Deposition (MOCVD) chamber and controlled such that the UV light beam is directed though a window defined in a wall of the MOCVD chamber.

30 Claims, 6 Drawing Sheets (51) Int. Cl.
  *H01L 29/66*   (2006.01)
  *C23C 16/48*   (2006.01)
  *C23C 16/52*   (2006.01)
  *C23C 16/458*  (2006.01)
  *C23C 16/04*   (2006.01)
  *H01L 29/205*  (2006.01)
  *H01L 29/778*  (2006.01)
  *H01L 33/32*   (2010.01)
  *H01L 33/00*   (2010.01)

(56) References Cited

U.S. PATENT DOCUMENTS

| | | | |
|---|---|---|---|
| 6,231,933 B1 | 5/2001 | Grant | |
| 6,726,769 B2 | 4/2004 | Boguslavskiy et al. | |
| 6,902,623 B2 | 6/2005 | Gurary et al. | |
| 7,462,243 B2 * | 12/2008 | Laflamme, Jr. | H01L 21/67069 |
| | | | 118/715 |
| 7,570,368 B2 | 8/2009 | Belousov et al. | |
| 7,666,323 B2 | 2/2010 | Boguslavskiy et al. | |
| 7,718,554 B2 | 5/2010 | Yoo et al. | |
| 8,133,322 B2 | 3/2012 | Nakamura et al. | |
| 8,287,646 B2 | 10/2012 | Mitrovic et al. | |
| 8,303,713 B2 | 11/2012 | Belousov et al. | |
| 8,715,418 B2 | 5/2014 | Chen | |
| 8,888,360 B2 | 11/2014 | Gurary et al. | |
| 8,895,107 B2 | 11/2014 | Gurary et al. | |
| 9,411,237 B2 * | 8/2016 | Xie | G03F 7/405 |
| | | | 257/76 |
| 2002/0076902 A1 | 6/2002 | Geusic | |
| 2004/0060518 A1 | 4/2004 | Nakamura et al. | |
| 2004/0175939 A1 | 9/2004 | Nakamura et al. | |
| 2006/0090850 A1 * | 5/2006 | Laflamme, Jr. | H01L 21/67069 |
| | | | 156/345.33 |
| 2006/0214156 A1 * | 9/2006 | Pan | B82Y 10/00 |
| | | | 257/40 |
| 2007/0284695 A1 | 12/2007 | Zani et al. | |
| 2010/0273320 A1 | 10/2010 | Käppeler et al. | |
| 2010/0300359 A1 | 12/2010 | Armour et al. | |
| 2010/0317140 A1 | 12/2010 | Brailove et al. | |
| 2012/0048198 A1 | 3/2012 | Yamaoka et al. | |
| 2012/0160170 A1 | 6/2012 | Yamaguchi et al. | |
| 2013/0167771 A1 | 7/2013 | Yamaguchi et al. | |
| 2013/0177706 A1 * | 7/2013 | Baluja | B05D 3/066 |
| | | | 427/226 |
| 2013/0235439 A1 * | 9/2013 | Yamaichi | C23C 14/06 |
| | | | 359/9 |
| 2013/0252404 A1 | 9/2013 | Krishnan et al. | |
| 2013/0340677 A1 | 12/2013 | Tas et al. | |
| 2013/0343425 A1 | 12/2013 | Tas et al. | |
| 2014/0014039 A1 | 1/2014 | Naito et al. | |
| 2014/0287142 A1 | 9/2014 | Boyd et al. | |
| 2015/0007771 A1 | 1/2015 | Silva et al. | |
| 2015/0017785 A1 | 1/2015 | Gu et al. | |
| 2015/0064361 A1 * | 3/2015 | Greer | C23C 16/45536 |
| | | | 427/509 |
| 2015/0064363 A1 | 3/2015 | Matthews et al. | |
| 2015/0075431 A1 | 3/2015 | Barriss et al. | |
| 2015/0162189 A1 * | 6/2015 | Xie | H01L 21/02118 |
| | | | 438/780 |

OTHER PUBLICATIONS

Bryan, Zachary, et al. "Fermi level control of compensating point defects during metalorganic chemical vapor deposition growth of Si-doped AlGaN". Applied Physics Letters, 105, 222101 (2014), 5 pages.
Bryan, Zachary, et al. "Fermi Level Control of Point Defects During Growth of Mg-Doped GaN". Journal of Electronic Materials, vol. 42, No. 5, Dec. 5, 2012, 5 pages.
Hoffman, Marc, et al. "Point defect management in GaN by Fermi-level control during growth". SPIE, 8986 (2014), 7 pgs.
Karlicek, Robert, et al. "High Power UV LED Industrial Curing Systems". Technical Report, US Department of Energy, May 15, 2012, 42 pages.
Eden, J.G. "VUV and UV Sources and Spectroscopic Applications". Technical Report, Dec. 1991, 143 pages.
Zhang, Yun. "Fabrication and Characterization of Gan Visible-Blind Ultraviolet Avalanche Photodiodes". Thesis, Georgia Institute of Technology, Aug. 2009, 73 pages.
PCT/US2016/043462, Written Opinion and Search Report dated Oct. 26, 2016, 11 pages.

* cited by examiner

METHOD AND APPARATUS FOR CONTROLLED DOPANT INCORPORATION AND ACTIVATION IN A CHEMICAL VAPOR DEPOSITION SYSTEM

TECHNICAL FIELD

Embodiments relate to processes or apparatuses specially adapted for the manufacture or treatment of semiconductor or solid-state devices or of parts thereof. More specifically, embodiments relate to using reduction or decomposition of a gaseous compound yielding a solid condensate (i.e., chemical vapor deposition or Metal Organic Chemical Vapor Deposition (MOCVD)), and bombardment of such structures with optical radiation during manufacture.

BACKGROUND

Chemical vapor deposition involves directing one or more gases containing chemical species onto a surface of a substrate so that the reactive species react and form a deposit on the surface. For example, compound semiconductors can be formed by epitaxial growth of a semiconductor material on a substrate. The substrate typically is a crystalline material in the form of a disc, commonly referred to as a "wafer." Compound semiconductors such as III-V semiconductors commonly are formed by growing layers of the compound semiconductor on a wafer using a source of a Group III metal and a source of a group V element. In one process, sometimes referred to as a "chloride" process, the Group III metal is provided as a volatile halide of the metal, most commonly a chloride such as $GaCl_2$ whereas the Group V element is provided as a hydride of the Group V element.

In an MOCVD process, the chemical species include one or more metal-organic compounds such as alkyls of the Group III metals gallium, indium, and aluminum, and also include a source of a Group V element such as one or more of the hydrides of one or more of the Group V elements, such as $NH_3$, $AsH_3$, $PH_3$ and hydrides of antimony. In these processes, the gases are reacted with one another at the surface of a wafer, such as a wafer of sapphire, Si, GaAs, InP, InAs or GaP, to form a III-V compound of the general formula $In_xGa_yAl_zN_AAs_BP_CSb_D$ where $x+y+z$=approximately 1, and $A+B+C+D$=approximately 1, and each of x, y, z, A, B, C and D can each be between 0 and 1. In some instances, bismuth may be used in place of some or all of the other Group III metals. MOCVD is conventionally used to grow semiconductor devices having p-n junctions, or with varying degrees of either n- or p-type dopant through the structure, by varying the conditions in the MOCVD reactor. For example, the type, quantity, or ratios of gases introduced into the reactor can be modified throughout the deposition process during growth of the device.

MOCVD can be used conventionally to produce a variety of semiconductor devices, including Gallium Nitride (GaN) semiconductor devices. Such examples of semiconductor devices, such as compound semiconductors based on group III-V elements, include LEDs (Light Emitting Diodes), FET (field electron transistor), MISFET (metal-insulator-semiconductor field-effect transistor), HEMT (high-electron-mobility transistor), CMOS (complementary metal-oxide semiconductor), and the like.

GaN devices are typically comprised of un-doped layers or intentionally doped layers. Layers that are doped can be doped with, for example, magnesium (Mg), zinc, or beryllium, which results in a p-type semiconductor; or they can be doped with a material such as germanium or silicon which results in an n-type semiconductor. Unintentionally incorporated impurities, such as carbon, oxygen, and many heavy metals, can greatly affect the optical, electrical resistivity and physical characteristics of the semiconductor films, and hence control of the concentration of these point-defects is desirable. Even at parts per million levels of these impurities, which typically have energy levels deep within the host material bandgap, significant changes in resistivity, non-radiative recombination rates, and sometimes lattice mismatch or surface morphologies can be observed. In particular, incorporation of carbon has a strong effect on the electrical conductivity of the films, with the films becoming more resistive as the carbon levels are increased. Heavily carbon-doped GaN is often used as a current-blocking layer in FET devices, and typically low concentrations of carbon are necessary for intentionally doped layers to increase electrical conductivity.

For many device structures, there are additional types of point-defects that can be created, and it is also generally desirable to reduce or control their density; such examples include the formation of hydrogen complexes (H-complexes) of Mg dopants, nitrogen vacancies ($V_N$), or $V_N$—Mg complexes. These point defects can become incorporated into the crystal structure of the GaN semiconductor during growth, leading to passivation or compensation of Mg acceptor levels. Passivation or compensation of the dopant reduces the overall electrically active dopant levels, which is generally undesirable.

Conventionally, such Mg-related point defects have been partially eliminated through post-growth annealing processes, which can dissociate Mg—H complexes. However, these post-growth annealing procedures are inefficient, both in terms of time of production and energy costs. In addition, they add an extra thermal budget to the existing epitaxial structure growth process. This added thermal exposure can result in solid-state diffusion of dopants or alloy constituent atoms, thereby resulting in less controlled, abrupt compositional and doping junctions Recent studies have shown that point defects can be controlled by applying ultraviolet (UV) light to the entire semiconductor wafer during the MOCVD growth process, wherein the UV light has an energy level above the bandgap of the material being deposited. The UV light generates minority carriers within the growing films, thereby altering the electrochemical potential (the quasi-Fermi levels of the material). This in turn can result in reduced background hydrogen incorporated during Mg doping, potentially alter the carbon impurity incorporation, and has been proposed to possibly reduce nitrogen vacancies in the film. Marc Hoffman et al., Point Defect Management in GaN by Fermi-Level Control During Growth, Proceedings of SPIE 8986 (Mar. 8, 2014). See also Zachary Bryan et al., *Fermi Level Control of Point Defects During Growth of Mg-Doped GaN*, 42 Journal of Electronic Materials 5 at 815 (2013).

Although this initial research identifies a possible mechanism for reducing the number of Mg—H, $V_N$, or $V_N$—Mg point defects and complexes, implementation remains challenging for at least three reasons. First, large volume production MOCVD processes are typically conducted in chambers that do not facilitate light ingress or have internal light sources. Second, even if a suitable mechanism were found to provide light to the interior of the MOCVD reactor, irradiating the entire wafer with UV light during the epitaxial growth process would be energy intensive over such a large deposition area. Third, operating the light source at a low energy level may be insufficient to dissociate all point defect complexes, while operating the light source at high energy could cause undesirable reactions between the residual MOCVD gases/vapors in the chamber, and the minimum and maximum acceptable energy levels for the applied light can change based on the precursors used in the MOCVD process.

SUMMARY

According to one embodiment of the claimed invention, a chemical vapor deposition system includes a chemical vapor deposition reactor. The chemical vapor deposition reactor includes a chamber, at least one wafer rotatably mounted within the chamber, a viewport defined in a wall of the chamber, and a gas injection system configured to deliver a gas mixture towards the at least one wafer. The chemical vapor deposition system further includes a UV light source for generating a UV light beam, the UV light source operably coupled to the viewport. The UV light beam can have a tunable wavelength, a tunable intensity, and a direction. A rastering subsystem that controls the UV light source is arranged external to the chamber and is configured to modify the direction of the UV light beam through the viewport towards the deposition surface on the at least one wafer to produce a raster pattern on a semiconductor layer formed on the at least one wafer mounted within the chamber.

According to another embodiment, a method for growing at least one semiconductor layer includes positioning a wafer within a chamber defined within chemical vapor deposition reactor, applying a gas mixture within the chamber to cause the at least one semiconductor layer to grow epitaxially on the wafer, and, while applying the gas mixture, using a rastering system to selectively direct a UV beam of light to produce a raster pattern on the at least one semiconductor layer, the UV beam can be tuned to a wavelength and an intensity based on the at least one semiconductor layer and the gas mixture so as to dissociate point defects in the at least one semiconductor layer.

According to another embodiment of the claimed invention, a semiconductor device, such as a compound semiconductor based on group III-V elements, is made by the method above, such that the semiconductor layers used to comprise the device have a reduced quantity of point defects.

The above summary of the invention is not intended to describe each illustrated embodiment or every implementation of the present invention. The detailed description and claims that follow more particularly exemplify these embodiments.

While embodiments are amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION

According to embodiments, a Metal Organic Chemical Vapor Deposition (MOCVD) system includes a chemical vapor deposition reactor having a window through which ultraviolet (UV) light can be routed. The UV light can be provided by a UV light source that is both tunable to different wavelengths, as well as capable of being aimed at specific portions of the interior of a chamber of the MOCVD system. For example, the UV light could be a mercury arc lamp, a mercury-xenon arc lamp, or a UV LED or LED array. In various embodiments, the UV lights are adapted to be tuned to a desired wavelength in the UV spectrum (typically about 180 nm to about 400 nm), and to be used to generate a beam of light that can be aimed at various parts of the semiconductor layer being grown in the MOCVD chamber in a raster pattern. The raster speed (defining the dwell time per illuminated area), UV light wavelength, and light intensity can each be modified to modulate the growth characteristics of the semiconductor layer with reduced passivation due to point defects. The overall flux per unit area of the UV radiation per raster scan can be determined by the exposure (or dwell) time and the intensity (power per unit area) of the incident optical beam illuminating the deposited semiconductor layer. The raster-scanned pattern can be used to illuminate all deposition area on the growth wafers. As long as the UV illumination is rastered across the entire semiconductor layer surface at a rate whereby the unexposed deposition thickness (defined by the growth rate) does not exceed the penetration depth of the UV light, which is typically several monolayers, the illumination will produce the desired effect of changing the quasi-Fermi levels in the material.

Figure 1:
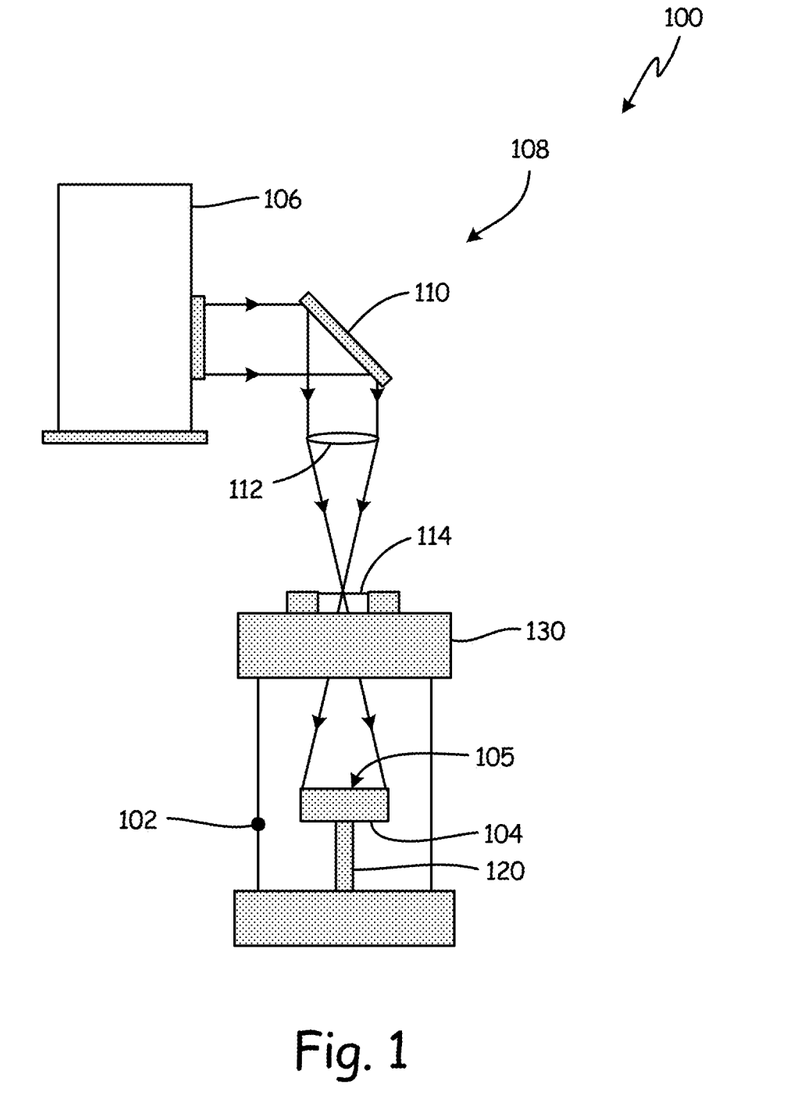
FIG. 1 is a cross-sectional view of a MOCVD system, according to an embodiment.

FIG. 1 is a cross-sectional schematic view of MOCVD system 100, according to an embodiment. MOCVD system 100 includes reactor 130, chamber 102, wafer carrier 104, wafer 105, a gas injection system (not shown), UV light source 106, and UV light guidance subsystem 108. Examples of gas injection systems are described in U.S. Pat. Nos. 8,303,713 and 8,287,646 and U.S. Patent App. Pub. No. 2010/0300359, the contents of which are hereby incorporated by reference. The aforementioned gas injection system delivers the gas mixture downwardly towards the at least one wafer. Another gas injection system that can be used in some embodiments is an inverted gas injection system. In this system, the at least one wafer is held in a susceptor, or wafer carrier, in a growth chamber and the surface of the at least one wafer on which epitaxial layers are to be grown is placed facedown (inverted) in the growth chamber and the gas injectors are mounted below the susceptor, or wafer carrier, such that the gas mixture flows upwardly towards the at least one wafer.

Examples of such inverted gas injection systems are described in U.S. Pat. No. 8,133,322, U.S. Patent App. Pub. No. 2004/0175939, and U.S. Patent App. Pub. No. 2004/0060518, the contents of which are hereby incorporated by reference herein. Another type of gas injection system is that for a barrel-type MOCVD reactor. Examples of such a reactor are described in U.S. Pat. No. 6,217,662 and U.S.

Pat. No. 6,231,933, the contents of which are hereby incorporated herein. Additional gas injections systems include those described in US Published Patent Applications 20140287142, 20100273320, 20150007771, 20130167771, 20140014039, 20120160170, and 20120048198, the contents of which are hereby incorporated herein by reference.

In the embodiment shown in FIG. 1, UV light guidance subsystem 108 includes mirror 110, lens 112, and viewport 114. Viewport 114, in addition to being a part of the light guidance subsystem 108, also forms a part of a wall of the chamber 102. Chamber 102 is significantly simplified in the view shown in FIG. 1. Chamber 102 defines the space in which the MOCVD process takes place. Chamber 102 is substantially hermetically sealed, and includes ingress ports (not shown) for various gases as well as access ports to insert and remove wafer carriers (also not shown). Some examples of suitable MOCVD chambers, reactor housings and systems are described in U.S. Pat. Nos. 8,895,107; 8,303,713; 8,287,646; and 6,902,623, the disclosures of which are hereby incorporated by reference. Commercially available MOCVD systems include those from Veeco Instruments Inc. such as K465i™, MaxBright, Propel™, and/or EPIK™700 systems.

Wafer 105 is a surface on which semiconductor layers are epitaxially grown within chamber 102. Depending upon the chamber 102, there are one or more wafers 105. Wafer 105 is supported by wafer carrier 104, which is removably attached to rotating spindle 120. In some embodiments, wafer 105 can be rotated by a rotating system that does not require spindle 120. Rotation of wafer carrier 104, or wafer 105 rotated by a rotating system that does not require spindle 120, can also be useful for rastering, as described in more detail below. Examples of such rotation methods are described in U.S. Pat. No. 6,726,769, U.S. Patent Application Publication 20130252404, and U.S. Patent Application Publication 20150075431, the contents of which are hereby incorporated by reference herein. In one embodiment, the epitaxially grown semiconductor layers are various layers which can form semiconductor structures such as an LED or HEMT (high electron mobility transistor), the descriptions of which are well known in the art.

Wafer 105 can be silicon, sapphire, silicon carbide, gallium nitride, aluminum nitride, or other crystalline substrates that support a first layer of epitaxially grown semiconductor material. As the semiconductor material is epitaxially deposited, layers of semiconductor material extend generally upwards with respect to the orientation shown in FIG. 1, away from wafer carrier 104.

UV light source 106 provides UV light or radiation, indicated in FIG. 1 by arrows illustrating the outgoing beam that can be directed into chamber 102 and onto wafer carrier 104 and wafer 105 as well as the epitaxially grown semiconductor layers. UV light source 106 can be, for example, a mercury arc lamp, a mercury-xenon arc lamp, or a UV-LED bulb or LED array. In some embodiments, UV light source 106 can be housed in a collimating structure, or be a UV laser, such that light emitted by UV light source 106 emanates in a particular direction and can be more easily directed to a desired target.

In some embodiments, UV light source 106 is adapted to have a selectively tunable wavelength. Depending on the type of material that is being grown within chamber 102, different levels of energy may be beneficial for the elimination of point defects. For example, in large bandgap materials, such as AlN, AlGaN, GaN, InGaN, SiC, SnGe, diamond, or BN, among others, it may be beneficial to use a shorter wavelength in order to provide sufficient energy to raise the quasi-Fermi levels to the extent that point defects are dissociated and can be eliminated. As such, it may be desirable to provide a UV light source 106 that can be tuned to a lower wavelength. For example, AlGaN semiconductor layers being grown in an MOCVD chamber at 1100° C., with an atomic ratio of about 0.65 Al to 0.35 Ga atoms ($Al_{0.65}Ga_{0.35}N$), has a bandgap of approximately 4 eV. Therefore, a wavelength of 309 nm or shorter would be desirable. In other embodiments with different materials or ratios, higher or lower wavelengths may be desired.

Conversely, where the bandgap of the epitaxially grown material is relatively lower, using a higher wavelength UV light source 106 may be sufficient, and less energy-intensive. In some cases, using too short of a wavelength could impede proper crystal growth in some materials. As such, it may be desirable to provide a UV light source 106 that can be tuned to a higher wavelength.

Additionally, some materials in the gas phase within chamber 102 could be affected by the radiation provided by UV light source 106. For example, if the radiation were at a resonant frequency of bond energies of the gas phase materials within the chamber 102, and such radiation were routed through the chamber 102, reactions could take place at inappropriate and/or undesirable locations within chamber 102, far from wafer 105. As such, it can be desirable to provide a UV light source 106 that can be tuned such that the wavelength of the UV light it emits can be tuned either higher or lower in order to avoid such resonant frequencies, while still providing sufficient energy to dissociate point defects in an epitaxially grown material layer on wafer 105.

In still further alternative embodiments, a targeted wavelength can be used to excite specific bonds within the material being grown. For example, the wavelength of UV light source 106 could be set to excite specific bonds related to the group III organic compounds (for example, TMGa, TMAl, TMIn and their associated radicals) or intermediary adducts formed between group III organic compounds and group V compounds such as $AsH_3$, $PH_3$, and $NH_3$.UV light guidance system 108 is a system that directs light to a desired target. In the embodiment shown in FIG. 1, for example, light guidance system 108 includes mirror 110, lens 112, and viewport 114. In alternative embodiments, light guidance system 108 can have more, fewer, or different elements, depending on the desired type of light guidance desired. For example, in alternative embodiments light guidance system 108 can include multiple mirrors, lenses, or viewports. In embodiments, mirrors (such as mirror 110) can be a part of a rastering system that changes the position of the mirror 110 as a function of time.

Mirror 110, as shown in FIG. 1, is a stationary mirror configured to route radiation produced by UV light source 106 towards wafer 105. In the embodiment shown in FIG. 1, this is accomplished by providing a roughly 90° turn in the direction of the radiation emitted by UV light source 106. Mirror 110 is often substantially smaller than UV light source 106. Because physical space can be constrained adjacent to UV reactor housing 102, and especially adjacent viewport 114, mirror 110 can provide beneficial flexibility in the positioning and orientation of UV light source 106. In some embodiments, mirror 110 can be positioned in such a way that it does not interfere with other scanning features, such as scanning DRT, or scanning blue pyros, which are described, for example, in U.S. Pat. No. 7,570,368 and U.S. Patent App. Pub. Nos. 2013/0340677 and 2013/0343425, respectively, the contents of which are hereby incorporated by reference herein. Appropriate positioning of mirror 110, as well as the other elements of UV light guidance system 108, can add functionality to the system 100 without requiring additional viewports or other access points to the interior of chamber 102.

Lens 112 can be used to focus the radiation provided by UV light source 106 to a desired point or region. For example, as shown in FIG. 1, lens 112 is used to direct the UV radiation, as indicated by arrows, to cover the entirety of wafer 105. However, in alternative embodiments, it is often useful to focus the radiation to a smaller portion of the wafer 105. For example, as described in more detail with respect to FIG. 2, in some embodiments the radiation can be directed to a thin strip of the wafer 105, along a radius of an epitaxially grown, circular wafer. In other embodiments, depending on the shape and material composition of the layer being grown, the rate of rotation of the build platform 104, and the wavelength and intensity of the radiation, lens 112 can be used to focus the radiation from UV light source 106 in different ways, as will be described in more detail below.

Viewport 114 is a portion of a wall of chamber 102 that permits for the ingress of radiation. In the embodiment shown in FIG. 1, for example, viewport 114 permits for the ingress of radiation produced by UV light source 106. Viewport 114 can be an optically UV transparent material such as, for example, a glass window, synthetic quartz, fused quartz or a sapphire window. Synthetic quartz, fused quartz, or sapphire can be used for the viewport 114, to prevent UV absorption of the short wavelength radiation transmitted through it. In general, any material may be used to form viewport 114 that is transparent within a desired wavelength range, corresponding to the bandgap of the material being grown and/or energy required to dissociate passivating point defects.

In some embodiments, viewport 114 can have a variety of sizes and shapes. For example, it may be desirable to provide optical access for a variety of tools, and accordingly a larger viewport 114, or even multiple viewports 114, are contemplated for different embodiments.

In some embodiments, system 100 can be used to grow a GaN based semiconductor device. During growth of a semiconductor structure using conventional systems, n-type and p-type doping is typically inefficient. One reason for such inefficiency is the high level of both threading dislocations and point defects that occur in the bulk layers due to the large lattice and thermal mismatch that can occur between the nitride layers and the wafer. This material system is further hampered by the relative inefficiency of N incorporation into the crystalline lattice during standard MOCVD growth conditions (carrier gas, growth temperature, Group III/Group V compound ratios and, in many cases, rotational speed of the wafer or wafer carrier), resulting in a high level of nitrogen vacancies. As previously described, such defects can act as point-source compensation centers to the dopants, reducing the overall electrically active dopant levels. System 100 reduces the incidence of such defects by rastering the deposition surface at a rate faster than the growth rate. System 100 can be used to grow a semiconductor structure or other solid state device having fewer point defects that would have been generated using a conventional system.

The rotation rate of the one or more wafers, whether or not loaded onto a wafer carrier, is coupled to the total flow of the process gases in the reactor to provide laminar flow of the gases across the deposition surface of the one or more wafers. From that, the raster scan rate can then be selected to focus on each point of the deposition surface during the course of epitaxial growth of a single (or multiple) monolayers of deposited material. The intensity of UV light source can be tunable to be between, for example, about 0.1 to 1000 W/cm$^2$ of incident power on the wafer 105.

Furthermore, the rotation speed of wafer carrier 104 may be based on the portion of the wafer 105 that is illuminated by the radiation produced by UV light source 106. For example, in some embodiments, light guidance system 108 can route the light produced by UV light source 106 to a radius of wafer 105. In other embodiments, for example embodiments in which UV light source 106 is collimated, the elements of light guidance system 108 can be used to raster the UV light across the surface of wafer 105. Rastering can be accomplished, for example, using a movable mirror 110 as a part of light guidance system 108.

Radiation from UV source 106, and optionally rastered and/or redirected by mirror 110, can be focused by lens 112 such that it will pass through viewport 114 and into chamber 102. By coordinating the wavelength and intensity of UV light source 106, and the positions of mirror 110 and lens 112 relative to viewport 114, an appropriate illumination and/or rastering pattern can be established that will cover the substantially the entirety of wafer 105 during the rotation of wafer carrier 104. In embodiments, depending upon the incident power and the raster scan rate of a surface image along wafer 105, large variations in intensity can be achieved. In one embodiment of the disclosure, the wavelength and intensity of the radiation can vary as a function of growth time, film thickness, or other factors.

By applying and/or rastering light at sufficiently low wavelength to compensate for point defects, lower deposition temperatures can be used during the MOCVD growth process. In a general MOCVD process, a first reactive gas such as a mixture of ammonia or other Group V hydride in admixture with one or more carrier gases such as $H_2$, $N_2$ or both is supplied through the first gas passage to form a series of first reactive gas streams. Similarly, a second reactive gas, such as a metal-alkyl in admixture with a carrier gas, is supplied through the second gas passage to form a series of second reactive gas streams which are interspersed between the first reactive gas streams. A carrier gas such as $H_2$, $N_2$ or a mixture thereof is interposed between each stream of the first reactive gas and the adjacent rows of streams of the second reactive gas. The streams of gases travel towards the vicinity of the wafer carrier, or susceptor, and the wafer(s) where the first and second reactive gases react with one another at the wafer surface to form a deposit as, for example, a III-V semiconductor.

The prospective lower growth temperatures enabled during UV-assisted doping, and the capability of eliminating post-growth high temperature anneal steps (to remove incorporated hydrogen, for example) can greatly improve the thermal budget for MOCVD grown materials. Thus, more atomically abrupt multi-quantum-well (MQW) regions, more precisely controlled doping profiles, and other epitaxial structure features that are affected due to solid-state diffusion and intermixing processes may be obtained from a lower thermal budget MOCVD growth methodology, in embodiments.

In accordance with various embodiments, some structures and device structure designs or wafers that were previously unachievable using conventional MOCVD growth techniques may be generated using the systems and methods described and/or claimed herein. Such previously-unachievable structures include structures that have relatively higher levels of conductivity/low resistivity, and accompanying lower series resistance heating and device lifetime limitations. By reducing the effect of point defects in these films, higher performance commercial visible and ultraviolet LEDs, for example, may be fabricated.

In embodiments, a susceptor can support a wafer on which deposition occurs. Temperature of the susceptor and the wafer can be controlled, to prevent temperature gradients which could cause physical deformation of the wafer. In alternative embodiments, deformation related to temperature gradients can be obviated by positioning the wafer in a ring-shaped holder/susceptor, for example, in which the center of the wafer is not arranged adjacent to other components having a different temperature. In still further embodiments, the wafer can be positioned in the reactor housing without any susceptor underlying the wafer at all. This can be accomplished, for example, by holding the edges of the wafer using electromagnetically-controlled chucks.

Figure 2:
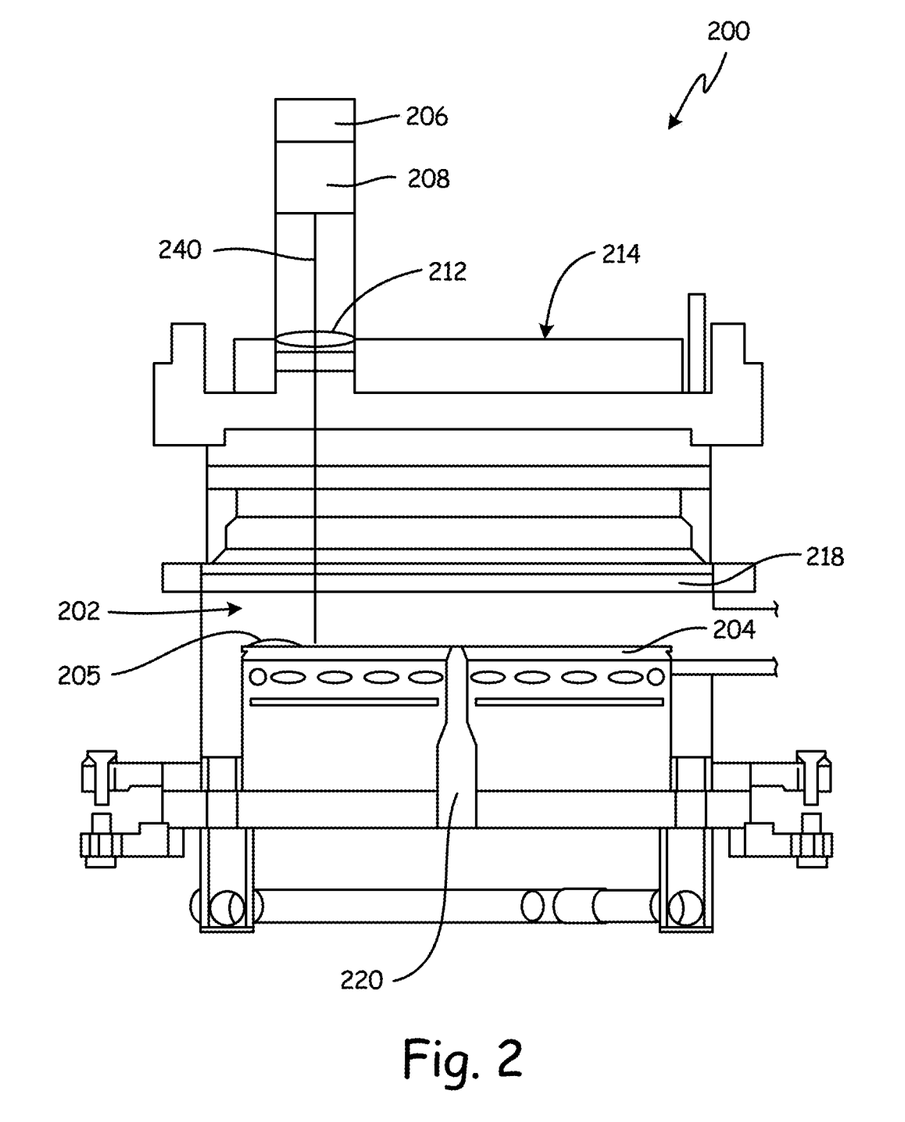
FIG. 2 is a cross-sectional schematic view of an MOCVD system, according to an embodiment.

FIG. 2 is a cross-sectional schematic view of an MOCVD system 200 which is similar to system 100. In general, like parts in each figure have reference numerals that are iterated by 100 from other embodiments described in other figures. For example, chamber 202 is substantially similar to chamber 102 of FIG. 1. Likewise, wafer carrier 204 as shown in FIG. 2 is substantially similar to wafer carrier 104 of FIG. 1, wafer 205 as shown in FIG. 2 is substantially similar to wafer 105 of FIG. 1, and viewport 214 of FIG. 2 is substantially similar to viewport 114 of FIG. 1.

During operation, a different part of the semiconductor layer grown on wafer 205 will be impinged by UV light beam 240, depending on the rate of rotation of wafer carrier 204.

In embodiments, the rate of rotation of wafer carrier 204 can be increased or decreased to provide sufficient radiation to dissociate point defects in the top one or more semiconductor layers formed on wafer 205. In some embodiments, UV light that passes through viewport 214 can have sufficiently high intensity and/or low wavelength to dissociate point defects in the top 2-3 layers of epitaxially grown material. As such, the rate of rotation of wafer carrier 204 can be set such that the wafer carrier 204 rotates approximately once for every 4-6 epitaxially grown layers. In other embodiments having higher opacity to the applied radiation, it may be more desirable to rotate wafer carrier 204 more rapidly, to dissociate point defects in fewer layers of grown material.

Additionally or alternatively, the size and orientation of viewport 214 can be modified in alternative embodiments. For example, in some embodiments, viewport 214 can be located above a radius of wafer 205 rather than the full diameter wide viewport 214 shown in FIG. 2. Where viewport 214 extends across the entire diameter of a generally circular wafer carrier 204/wafer 205 arrangement, this can be referred to as a "full diameter viewport" or a full slit style viewport. Similarly, a viewport that extends only along at least half of the width of a generally circular wafer carrier/wafer arrangement can be referred to as a "radial viewport." In still further embodiments, other shapes of viewport 214 can be used, which permit for rastering of radiation onto wafer 205. An example of another type of viewport contemplated herein is one or more radially-extensive viewports. A radially-extensive viewport is a viewport that has the capability of changing the radial position of the UV light source without removing the UV light source from the viewport. Such a radially-extensive viewport can include radially-extending rails that allow the UV light source to slide thereon from one radial position to another without removal from the viewport. A radially-extensive viewport of this type is described further in U.S. Pat. No. 8,888,360, the contents of which are hereby incorporated herein by reference. Other types of viewports can be readily discernable by a skilled artisan. Regardless of the type and/or configuration(s) of viewport used, in various embodiments the effective viewport geometry provides for the UV light beam to be incident over the entire semiconductor layer surface by allowing full optical access to image the entire surface of the semiconductor layer formed on the at least one wafer or deposition surface.

Gas injector system 218 introduces reaction gases into chamber 202. Typically, gas injector system 218 remains fixed while wafer carrier 204, and thus wafer 205, rotates, and therefore viewport 214 can also be kept fixed while wafer 205 rotates. This results in a changing portion of wafer 205 being visible from the exterior side of viewport 214 with time.

Figure 3:
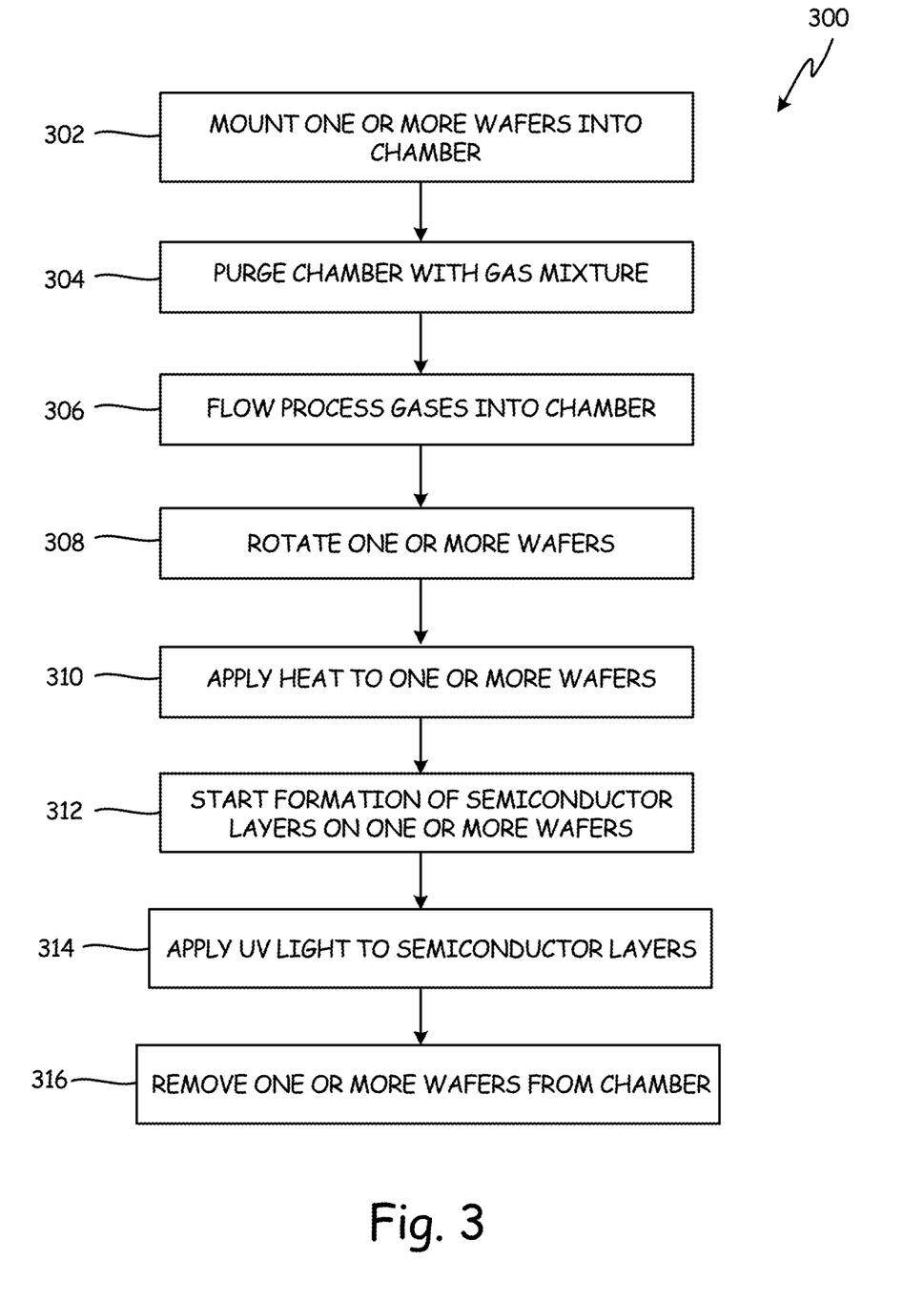
FIG. 3 is a flowchart of a method for UV exposure of a semiconductor layer during epitaxial growth, according to an embodiment.

FIG. 3 is a flowchart of a method 300 for UV exposure of a semiconductor layer during epitaxial growth. Method 300 is one example for producing a semiconductor layer or other epitaxially grown structure that includes a reduced number of point defects, as compared with conventionally produced wafers.

In step 302, one or more wafers are mounted in a chamber. The one or more wafers can be, for example, a sapphire, silicon, or other crystalline structure as described above. The one or more wafers can be loaded onto a rotatable wafer carrier within an MOCVD chamber, for example, as described above. The one or more wafers provide a suitable substrate for the subsequent epitaxial growth of the desired semiconductor layer.

In step 304, the chamber is purged with a gas mixture. For example, according to the system depicted in FIG. 2, gas injector system 218 can be used to introduce gases into the chamber. These gases can be an appropriate mix of ultrapure precursors and other gases used in the epitaxial growth of the desired semiconductor layer. Step 304 can also include removing gases that are not desired. For example, step 304 could include first creating a vacuum in the chamber, then adding the desired gases. In embodiments, this results in a pressure within the chamber that is low to medium vacuum (e.g., between 1 kPa and 101 kPa).

Step 306 provides for the introduction of process gases into the chamber. As soon as the process gases are introduced into the chamber, the one or more wafers are rotated as in step 308. Rotating the one or more wafers at this stage sets up laminar flow of the process gases within the chamber.

At step 310, heat is applied to the one or more wafers. Heaters, such as electrical resistance heaters which are well known in the art, can be used. Examples of such heaters are described in U.S. Pat. Nos. 5,759,281 and 7,666,323, the contents of which are hereby incorporated herein by reference.

With the one or more wafers rotating in the heated environment with flowing process gases, semiconductor layers start to form in step 312.

At step 314, UV light is applied to the semiconductor layer. UV light can be introduced to the chamber via the viewport. The UV light applied impacts the semiconductor layer during epitaxial growth. The UV light can be used to dissociate point defects such as carbon impurities, hydrogen complexes, or nitrogen vacancies in the semiconductor layer during epitaxial growth. In some embodiments, there may be a "strip" of UV light introduced into the chamber along the entire length of a viewport. In other embodiments, the light can be a point, which can be rastered back and forth across a strip of the viewport in a pattern that provides a desired level of light to each part of the semiconductor layer formed on the wafer along the strip beneath the viewport.

In some embodiments, the intensity of the UV-light can be modified to dissociate defects not only in a top semiconductor layer, but in the top several semiconductor layers. The depth to which such UV treatment is capable of providing a desired reduction of point defects is dependent on the type of semiconductor material being grown, the wavelength of the light, the intensity of the light, and how long the light rests on each part of the semiconductor layer.

Since many semiconductor layers may be grown on the wafers, it will be appreciated that in many embodiments, steps 306 to 314 will be performed many times. In addition, steps 312 and 314 can be performed in a sequential manner or simultaneously, depending upon the semiconductor layer being epitaxially grown and the desired characteristics of the semiconductor layer. For example, if steps 312 and 314 were performed in a sequential manner, (i) a layer would be grown in step 312 to a particular thickness; (ii) growth of the layer would be stopped; (iii) UV light in step 314 would be applied to the grown layer for a particular time and intensity; (iv) growth of the layer would resume as in step 312; and then repeating steps (ii) to (iv) until the desired semiconductor layers and/or device is grown. If steps 312 and 314 are performed in a simultaneous manner, as soon as a layer is beginning to be deposited in step 312, the UV light is applied to the layer while each subsequent layer is being grown with the understanding that the intensity of the UV light can be adjusted depending upon the type of layer(s) being grown.

The parameters associated with each of steps 306, 308, 310, and 314 are interdependent. The speed of rotation, the intensity of the light, the wavelength of the light, the rastering pattern, and the quantity and mixture of process gases can all be adjusted throughout the process to complement and/or counter one another.

In step 316, after the desired semiconductor layers have been grown, the one or more wafers are removed from the chamber and sent for further processing.

Figure 4:
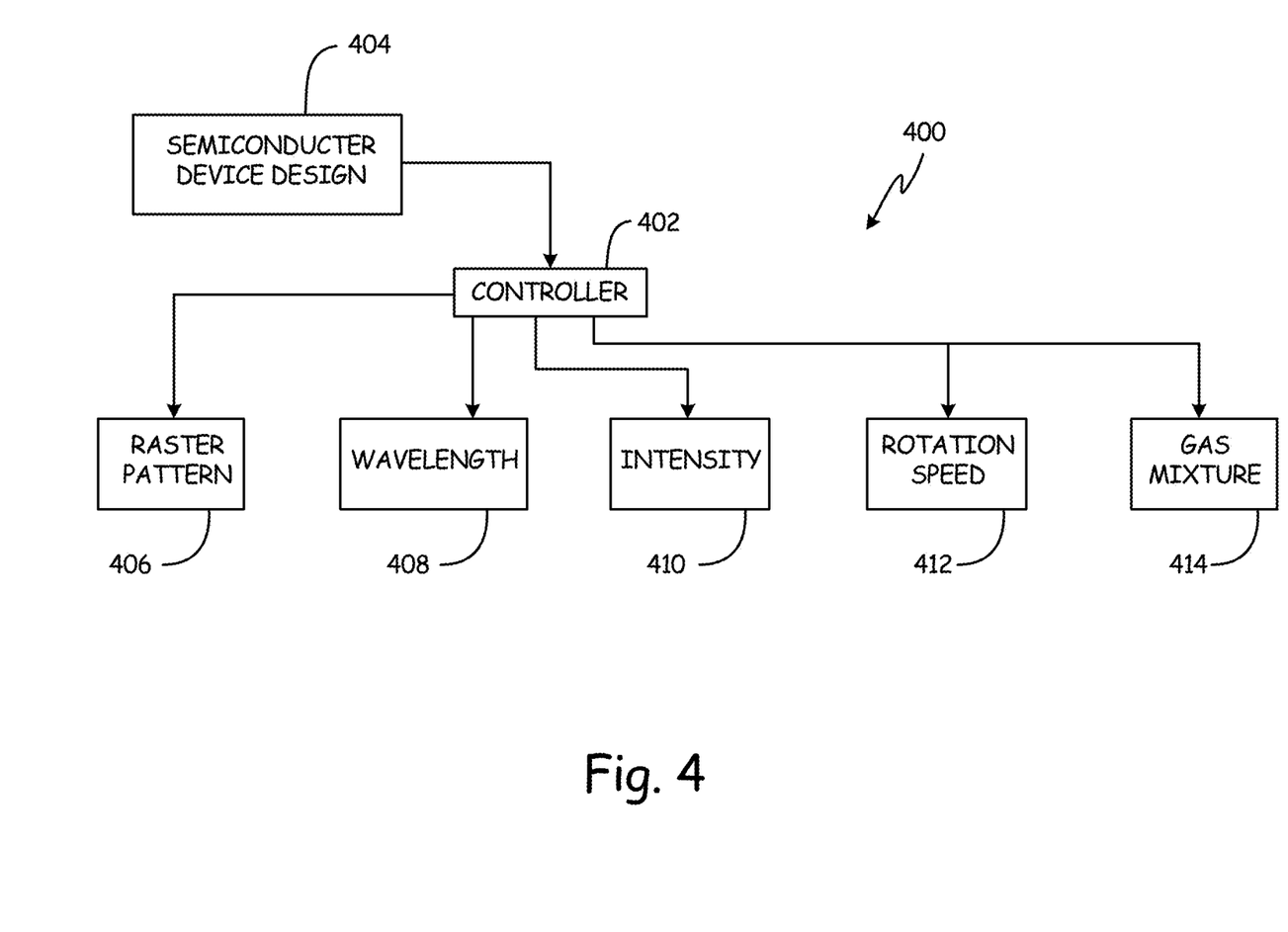
FIG. 4 is a schematic of a control system for an MOCVD reactor, according to an embodiment.

FIG. 4 is a schematic diagram of a control system 400 that can be used to modify, balance, and/or adjust these parameters to generate a desired epitaxially grown structure. In FIG. 4, a controller 402 receives instructions for forming a semiconductor device 404. These instructions can be generated before structure growth begins, or can be adjusted during growth, in various embodiments.

In order to build the desired structure, controller 402 can send and receive information to and from other controller or microprocessor systems associated with operational systems, such as systems 100 or 200 as previously described with respect to FIGS. 1 and 2. For example, controller 402 sends instructions, in the form of raster pattern 406, to a UV light source/light guidance system. For example, the raster pattern 406 instructions could be sent to a mirror that modifies the beam path from a UV light source to a viewport and then onto the semiconductor layer. The raster pattern is dependent upon any one of the rotational speed of the wafer(s) [or wafer carrier], the growth rate of the deposited (or formed) semiconductor layers, and/or the wafer layout, or the geometrical configuration, of one or more wafers on the wafer carrier. In addition, the raster pattern generally covers the entire wafer surface within about 1 to about 10 monolayers of the deposited material.

Controller 402 can also send instructions regarding a desired UV light wavelength and/or intensity levels during growth to a UV light source and light guidance system. Controller 402 can send an instruction to tune a UV light source to a desired wavelength 408, which can be changed during processing depending on the type of material that is being grown, or depending on the temperature of the chamber, among other factors. Controller 402 can likewise send information regarding UV light intensity 410. This intensity instruction 410 can be modified depending on the rotation speed or raster pattern, or the material being grown, for example.

Controller 402 can also send instructions regarding rotation speed instruction 412 to the wafer carrier to control how fast the wafer carrier rotates under the applied light. The rotation speed can be increased as desired to ensure that each portion of a structure that is being built upon a wafer mounted on the wafer carrier is irradiated before too many layers of epitaxially grown structures are deposited, leading to point defects at levels that are too deep to be influenced by the UV irradiation. Similarly, during periods of slower epitaxial growth, the rotation speed can be reduced (or the raster speed increased) as desired.

Instructions regarding the gas mixture 414 can be sent to the gas injector system and/or valves associated with each of the gases being used to produce the wafer. These instructions 414 can be modified during the growth of the wafer according to the semiconductor device design instructions 404, in embodiments. Furthermore, these instructions can cause increases or decreases in the growth rate of the semiconductor material, which can have an impact on the rotation speed instructions 412 and raster pattern 406. Furthermore, some gases may have resonant frequencies that should be avoided by the UV light. Accordingly, it may be desirable in certain embodiments to modify wavelength instructions 408 based on the gas mixture instructions 414.

Figure 5:
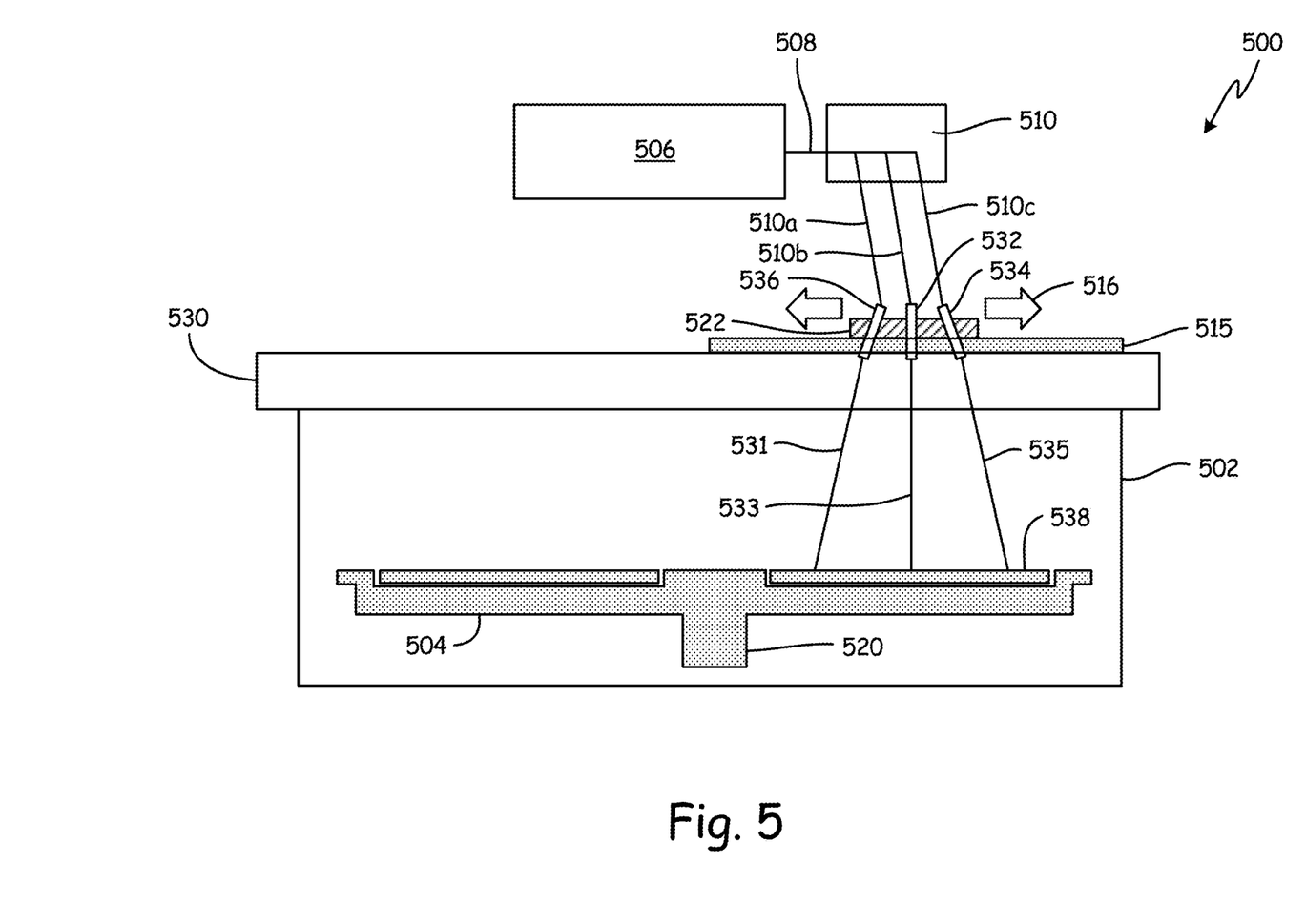
FIG. 5 is a cross-sectional view of an MOCVD system, according to another embodiment.

FIG. 5 is a cross-sectional view of an MOCVD system according to another embodiment. System 500, similar to system 100 discussed above, includes reactor 530 and chamber 502. Wafer 538, similar to wafer 105 discussed above, is a surface on which epitaxially deposited semiconductor layers are grown within chamber 502. Depending upon the chamber design and size 502, there are one or more wafers 538. Wafer 538 is supported by wafer carrier 504, which is removably attached to rotating spindle 520. In some embodiments, wafer 538 can be rotated by a rotating system that does not require spindle 520.

UV light source 506, similar to UV light source 106 described above, provides UV light or radiation, through conduit 508, to multi-channel beam source 510. Multi-channel beam source 510 splits the UV light or radiation from UV light source 506 into more than one beam. As an example shown in FIG. 5, the beam from UV light source 506 is split into three beams that travel through fibers 510a, 510b, and 510c. Fibers 510a, 510b, and 510c are fiber optic cables which act as waveguides to transport the light (near loss-less transmission). The beam size of beams 531, 533, and 535 can be adjusted by changing the diameter of their respective fibers and the focal length of the respective lens sets. Fibers 510a, 510b, and 510c are connected respectively to beam mounts 532, 534, and 536 which are mounted in a linear slider 522 which is mounted in viewport 515. Linear slider 522 can move back and forth, allowing beams 531, 533, and 535 to be rastered across the surface of wafer 538 along the viewport 515 in the direction of arrows 516.

Figure 6A:
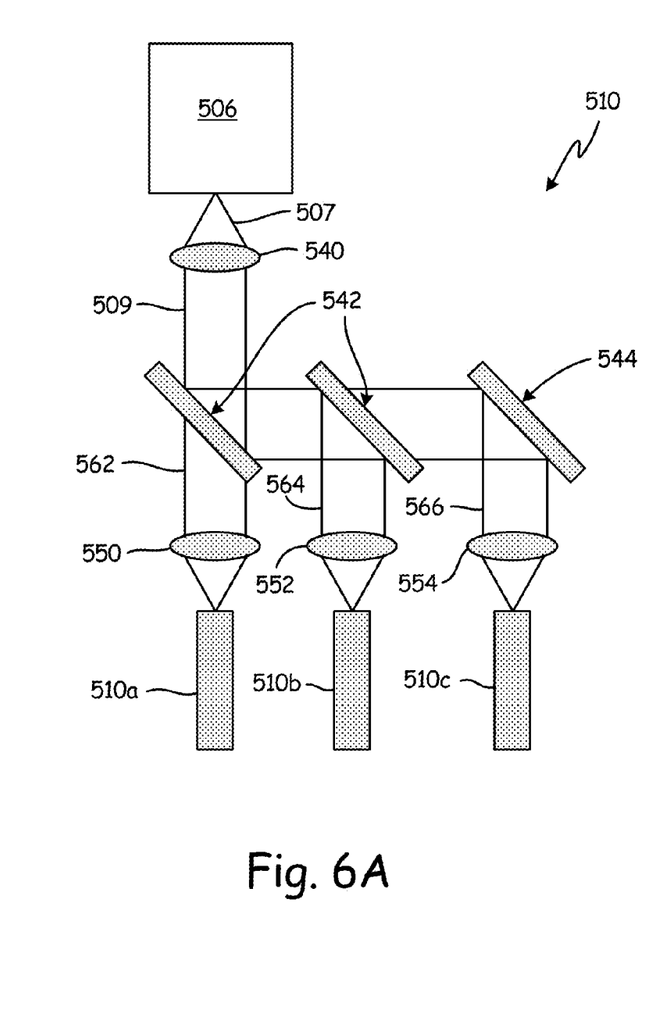
FIGS. 6A and 6B are cross-section views of portions of FIG. 5.

FIG. 6A shows more details of multi-channel beam source 510. When UV light source 506 sends beam 507 (which is in conduit 508) into multi-channel beam source 510, beam 507 is then focused through lens set 540 and then passes through beam splitters 542 and is reflected off of mirror 544 to form three beams 562, 564, and 566. Those skilled in the art will appreciate that multi-channel beam source 510 could have more or less split beams, as well as different sizes, angles, and shapes associated with each beam, depending upon, for example, the size of the surface to be rastered or the type of surface to be rastered.

Figure 6B:
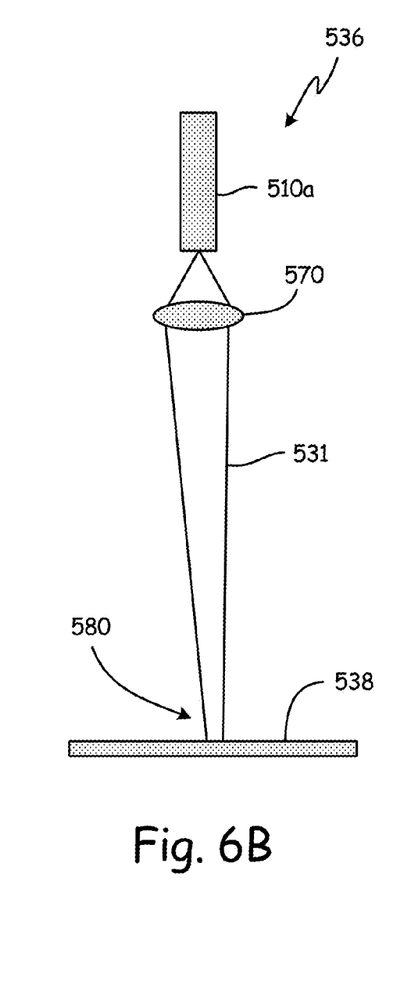

Beams 562, 564, and 566 then pass through lens sets 550, 552, and 554, respectively and are focused into fibers 510*a*, 510*b*, and 510*c*, respectively. These fibers 510*a*, 510*b*, and 510*c* then pass through a lens set and then impact wafer 538. For example, as shown in FIG. 6B, fiber 510*a* transmits beam 562 (see FIG. 6A), that has passed through lens set 550, through lens set 570, forming beam 531 which then impacts the surface of wafer 538 at point 580.

The number of beams can be adjusted based upon desired illumination coverage and scan time. When using a multi-channel beam source, the positions of beam splitters and mirror are fixed at an angle to cover the interested illumination range on the wafer. Typically, the illumination spot size (580) can range from about 4 to about 7 mm with a typical depth of field of about 20 mm. By having multiple beams non-perpendicular to the scanning axis, a wider range of radius underneath the viewport can be covered (as shown in FIG. 5). The beams can be configured to fully expose a wafer carrier even when the viewport does not extend across the entire radius. The UV light can be equally distributed in intensity among the different fibers, or skewed to favor either the middle fiber or the two outermost fibers to meet desired needs. In skewed embodiments, the UV light can skew by selecting different beam splitter reflectance/transmittance ratios. The linear scan position cycle can be developed such that at the outer extremities of the scan position and/or the overlap in scan areas circumscribed by the middle fiber path compared to the outer paths, providing for a more uniform exposure across the entire carrier.

Another embodiment includes a semiconductor processing system which comprises plurality of processing chambers located within a single vacuum chamber wherein each processing chamber is self-contained and can provide a different or same type of process, such as the systems described in U.S. Pat. No. 8,715,418. At least one wafer can be rotatably mounted in each processing chamber in a similar fashion as discussed above. Some of the processing chambers can be adapted for and provided with appropriate hardware and systems to provide MOCVD, ALD (atomic layer deposition), ALE (atomic layer etching), PVD (physical vapor deposition, CPVD (chemical plasma vapor deposition), and other types of deposition methods while other of the processing chambers can be adapted for and provided with appropriate hardware and systems for the UV light source/rastering subsystem, metrology, thermal treatment, and other non-deposition treating and testing methods. The single vacuum chamber that houses the plurality of processing chambers can be outfitted with appropriate gas injection systems, exhaust, and heating hardware and systems. The processing chambers have a top portion and a bottom portion. The top portion is built into a cover of the single vacuum chamber. The top portion can contain gas injection systems and other processing systems typically found in semi processing systems or can contain various metrology instruments, thermal and other non-deposition treating systems, testing systems, and the UV light source/rastering subsystem. The top portion can be modular so that various processing systems or instruments can be inserted or removed as needed, depending upon the types of layers, testing, and/or treatment to be performed. The bottom portion of the processing chambers are mounted within a carousel that is rotated in a horizontal plane on a central axis within a base of the single vacuum chamber by an appropriate rotating mechanism and system mounted underneath the carousel in the single vacuum chamber. The bottom portion of each processing chamber contains hardware, as described above, for mounting and rotating at least one wafer in a horizontal plane on a central axis within each processing chamber, exhaust ports, heating systems, and other hardware and systems that would be useful for either semi layer growth processing or various metrology instruments, thermal and other non-deposition treating systems, testing systems, and the UV light source/rastering subsystem, depending upon the process to be performed in a particular processing chamber. The single vacuum chamber may also be outfitted with shutters, load locks, transfer chambers, robotic arms, and other systems useful in mounting and unmounting at least one wafer within each processing chamber within the single vacuum chamber.

When the top portion and bottom portion of each processing chamber come together, or engaged, by closing the cover of the single vacuum chamber on the base of the single vacuum chamber, each processing chamber is sealed off from each other to prevent process gases or exhausts from one processing chamber to enter or contaminate another processing chamber. The sealing of the processing chamber can be done by physical barriers, vacuum ports, and/or inert gas curtains, in embodiments.

Each processing chamber will perform a specific semi growth process, testing, thermal treatment, UV light source/rastering subsystem treatment, or other treatment on the at least one wafer, depending upon the type of semiconductor layers to be grown for a particular semiconductor device. For example, a single vacuum chamber could contain four processing chambers—two for MOCVD semi layer growth and two for UV light source/rastering subsystem. The chambers could be arranged on the carousel so that the MOCVD semiconductor layer growth chambers are not adjoining. At least one wafer can be placed within each process chamber and for those at least one wafer placed in a MOCVD semiconductor layer growth chamber, a particular layer(s) can be grown, depending upon the daily need of the semiconductor manufacturer. Sensors within the non-MOCVD semiconductor layer growth chambers can detect whether semiconductor layers have been grown on the at least one wafer such that if no layers are grown (that is, an uncoated wafer is present in the chamber), only those treatments applicable to uncoated wafers will be applied. Once the particular layer(s) is grown in the MOCVD semiconductor layer growth chambers, the carousel is rotated so that the at least one wafer on which a semiconductor layer has been grown is now in the processing chamber for UV light source/rastering subsystem. While a semiconductor layer is grown on the uncoated wafers placed in the MOCVD semiconductor layer growth chambers, those wafer(s) on which a semiconductor layer has been grown can be treated with the UV light source/rastering subsystem. When the desired layers and treatments have been completed, the carousel is rotated so that the coated wafers processed with the UV light source/rastering subsystem are located within the MOCVD semiconductor layer growth chambers, and the recently coated wafers from the MOCVD semiconductor layer growth chambers are located in the processing chamber where the UV light source/rastering subsystem can be applied. This sequence can be repeated until the desired thickness of a given semiconductor layer has been grown and treated. The fully grown and treated at least one wafer can be removed from the single vacuum chamber for further processing.

Persons of ordinary skill in the relevant arts will recognize that the invention may comprise fewer features than illustrated in any individual embodiment described above. The embodiments described herein are not meant to be an exhaustive presentation of the ways in which the various features of the invention may be combined. Accordingly, the embodiments are not mutually exclusive combinations of features; rather, the invention can comprise a combination of different individual features selected from different individual embodiments, as understood by persons of ordinary skill in the art. Moreover, elements described with respect to one embodiment can be implemented in other embodiments even when not described in such embodiments unless otherwise noted. Although a dependent claim may refer in the claims to a specific combination with one or more other claims, other embodiments can also include a combination of the dependent claim with the subject matter of each other dependent claim or a combination of one or more features with other dependent or independent claims. Such combinations are proposed herein unless it is stated that a specific combination is not intended. Furthermore, it is intended also to include features of a claim in any other independent claim even if this claim is not directly made dependent to the independent claim.

Any incorporation by reference of documents above is limited such that no subject matter is incorporated that is contrary to the explicit disclosure herein. Any incorporation by reference of documents above is further limited such that no claims included in the documents are incorporated by reference herein. Any incorporation by reference of documents above is yet further limited such that any definitions provided in the documents are not incorporated by reference herein unless expressly included herein.

For purposes of interpreting the claims, it is expressly intended that the provisions of Section 112, sixth paragraph of 35 U.S.C. are not to be invoked unless the specific terms "means for" or "step for" are recited in a claim.

What is claimed is:

1. A chemical vapor deposition system comprising:
a chemical vapor deposition reactor including:
a chamber;
a rotatable wafer carrier adapted to receive at least one wafer and rotate at a predetermined rotation speed during epitaxial growth;
at least one wafer mounted to the rotatable wafer carrier within the chamber;
a viewport defined in a wall of the chamber; and
a gas injection system configured to deliver a gas mixture towards the at least one wafer;
a UV light source configured to generate a UV light beam, the UV light source operably coupled to the viewport;
a rastering subsystem in communication with the UV light source and adapted to control the UV light beam through the viewport towards the at least one wafer to produce a raster pattern on a semiconductor layer formed on the at least one wafer mounted within chamber such that, during epitaxial growth, in response to the predetermined rotation speed the UV light beam is configured to be incident upon a plurality of regions of the semiconductor layer such that point defects in such regions are dissociated.

2. The chemical vapor deposition system of claim 1, wherein the UV light source is selectively tuned to raise a quasi-Fermi level of the semiconductor layer and thereby dissociate point defects in the semiconductor layer without high temperature post-growth annealing of the semiconductor layer.

3. The chemical vapor deposition system of claim 1, wherein the semiconductor layer includes an undoped or doped layer formed of a large bandgap material and wherein the UV light source is selectively tuned to alter a resistivity of the undoped or doped layer via modulation of point defect density.

4. The chemical vapor deposition system of claim 1, wherein the UV light source is tuned to produce an energy level different than an energy level that affects either gas-phase reactions or surface atom chemical reactions of material grown on the semiconductor layer.

5. The chemical vapor deposition system of claim 1, wherein the UV light beam is tuned to a wavelength suitable to excite specific bonds relating to group III organic compounds or intermediary adducts formed between the group III organic compounds and group V compounds.

6. The chemical vapor deposition system of claim 1, wherein the raster pattern is dependent upon one or more of rotational speed of the one or more wafers, growth rate of deposited semiconductor layers and/or layout of the at least one wafer.

7. The chemical vapor deposition system of claim 1, wherein the rastering system controls a flux of the UV light beam in response to the characteristics of the deposited layer(s).

8. The chemical vapor deposition system of claim 1, wherein the UV light source includes an array of UV LED sources, at least some of which emit different wavelengths.

9. The chemical vapor deposition system of claim 1, wherein the viewport is configured in a geometry allowing full optical access to image the entire surface of the semiconductor layer.

10. The chemical vapor deposition system of claim 1, wherein the window is made of optically UV transparent material.

11. The chemical vapor deposition system of claim 1, wherein the at least one wafer comprises at least one epitaxially grown semiconductor layer.

12. A semiconductor processing system configured for epitaxial growth of one or more device layers on at least one wafer, the system comprising:
a single vacuum chamber comprising a plurality of processing chambers, each of the plurality of processing chambers having a top portion and a bottom portion, the single vacuum chamber having:
a cover containing the top portion of each of the plurality of processing chambers, each top portion having at least a gas injection system configured to deliver a gas mixture, and at least one of metrology instruments, thermal and other non-deposition treating systems, and testing systems, a viewport defined in the cover, and a UV light source configured to generate a UV light beam, the UV light source operably coupled to the viewport and in communication with a rastering subsystem; and
a base comprising a carousel rotatably mounted within the base, the carousel containing the bottom portion of each of the plurality of processing chambers, each bottom portion adapted to receive at least one wafer rotatably mounted therein and rotate at a predetermined rotation speed during epitaxial growth from the gas mixture, wherein when the top portion and the bottom portion of each of the plurality of processing chambers are engaged by closing the cover on the base, each of the plurality of processing chambers are sealed off from each other processing chamber, and wherein the rastering subsystem is in communication with the UV light source and adapted to control the UV light beam through the viewport towards the at least one wafer during epitaxial growth to produce a raster pattern on a semiconductor layer formed on the at least one wafer mounted within chamber in response to the predetermined rotation speed such that the UV light beam is configured to be incident upon a plurality of regions of the semiconductor layer such that point defects in such regions are dissociated.

13. A method for epitaxial growth of at least one semiconductor layer comprising:
positioning at least one wafer within a chamber defined within a chemical vapor deposition reactor, the chemical vapor deposition system comprising:
a rotatable wafer carrier adapted to receive the at least one wafer;
a viewport defined in a wall of the chamber; a gas injection system configured to deliver a gas mixture towards the at least one wafer:
a UV light source configured to generate a UV light beam, the UV light source operably coupled to the viewport: and
a rastering subsystem in communication with the UV light source and adapted to control the UV light beam through the viewport towards the at least one wafer: and rotating the rotatable wafer carrier at a predetermined rotation speed during epitaxial growth of the at least one wafer;
applying a gas mixture within the chamber to cause the at least one semiconductor layer to grow epitaxially on the at least one wafer; and selectively directing a UV light beam through a rastering system to produce a raster pattern on the at least one semiconductor layer, the UV light beam selectively tuned to the at least one semiconductor layer and the gas mixture during the rotating of the rotatable wafer carrier and in response to the predetermined rotation speed such that the UV light beam is configured to be incident upon a plurality of regions of the semiconductor layer so as to dissociate point defects in the at least one semiconductor layer.

14. The method of claim 13 further comprising tuning the UV beam to raise a quasi-Fermi level of the at least one semiconductor layer and thereby dissociate point defects in the at least one semiconductor layer without high temperature post-growth annealing of the least one semiconductor layer.

15. The method of claim 13, wherein the at least one semiconductor layer includes an undoped or doped layer formed of a large bandgap material, and wherein the UV light beam is selectively tuned to alter a resistivity of the undoped or doped layer via modulation of point defect density.

16. The method of claim 13, wherein the UV light beam is tuned to produce an energy level different than an energy level that affects either gas-phase reactions or surface atom chemical reactions of the material grown on the at least one semiconductor layer.

17. The method of claim 13, further comprising tuning the UV light beam to a wavelength suitable to excite specific bonds relating to group III organic compounds or intermediary adducts formed between the group III organic compounds and group V compounds.

18. The method of claim 14, further comprising selecting a raster pattern based on one or more of rotational speed of the one or more wafers, growth rate of deposited semiconductor layers and/or layout of the one or more wafers.

19. The method of claim 14, further comprising varying the predetermined rotation speed during epitaxial growth during application of the gas mixture.

20. The method of claim 13, wherein the rotation speed is selected such that a predetermined number of semiconductor layers are grown per rotation.

21. The method of claim 17, wherein the UV light beam is tuned to an intensity based on the composition of the semiconductor layer.

22. The method of claim 13 wherein the gas mixture and UV light beam are applied in a sequential manner.

23. The method of claim 13 wherein the gas mixture and the UV light beam are applied in a simultaneous manner.

24. The method of claim 17, wherein the UV light beam is tuned to a wavelength based on the composition of the deposited semiconductor layer.

25. A semiconductor device made by the process of: positioning at least one wafer within a chamber defined within a chemical vapor deposition reactor including:
a rotatable wafer carrier adapted to receive the at least one wafer and rotate at a predetermined rotation speed during epitaxial growth; a viewport defined in a wall of the chamber; a gas injection system configured to deliver a gas mixture towards the at least one wafer;
a UV light source configured to generate a UV light beam, the UV light source operably coupled to a viewport: and a rastering subsystem in communication with the UV light source;
applying a gas mixture within the chamber wherein application of the gas mixture causes one or more semiconductor layers to grow epitaxially on the wafer; and
while applying the gas mixture, using a rastering system adapted to control the UV light beam to selectively direct a UV light beam through the viewport towards the at least one wafer during epitaxial growth to produce a raster pattern on the one or more semiconductor layers thereof in response to the predetermined rotation speed such that the UV light beam is configured to be incident upon a plurality of regions of the semiconductor layer, the UV light beam selectively tuned to the one or more semiconductor layers and the gas mixture so as to dissociate point defects in the one or more semiconductor layers.

26. The semiconductor device of claim 25, further comprising tuning the UV light beam to raise a quasi-Fermi level of the one or more semiconductor layers and thereby dissociate point defects in the one or more semiconductor layers without high temperature post-growth annealing of the one or mop semiconductor layers.

27. The semiconductor device of claim 25, wherein the one or more semiconductor layers includes an undoped or doped layer formed of a large bandgap material, and wherein the UV light beam is selectively tuned to alter a resistivity of the undoped or doped layer via modulation of point defect density.

28. The semiconductor device of claim 25, wherein the process further comprises tuning the UV light beam to a wavelength to excite specific bonds relating to group III organic compounds or intermediary adducts formed between group III organic compounds and group V compounds.

29. The semiconductor device of claim 25, wherein the process further comprises rotating the at least one wafer at a rotation speed such that a predetermined number of layers of the one or more semiconductor layers are grown per rotation.

30. The semiconductor device of claim 29, wherein the predetermined number of one or more semiconductor layers is selected based on the intensity of the UV light beam and a composition of the one or more semiconductor layers.

* * * * *